(12) United States Patent
Kittl et al.

(10) Patent No.: US 6,372,566 B1
(45) Date of Patent: Apr. 16, 2002

(54) METHOD OF FORMING A SILICIDE LAYER USING METALLIC IMPURITIES AND PRE-AMORPHIZATION

(75) Inventors: Jorge A. Kittl, Plano; Qi-Zhong Hong, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/110,034

(22) Filed: Jul. 2, 1998

Related U.S. Application Data

(60) Provisional application No. 60/051,725, filed on Jul. 3, 1997.

(51) Int. Cl.⁷ .......................................... H01L 21/8238
(52) U.S. Cl. ..................... 438/206; 438/158; 438/162; 438/528; 438/532; 438/533; 438/659
(58) Field of Search ................................ 438/528, 532, 533, 659, 158, 206, 162

(56) References Cited

U.S. PATENT DOCUMENTS

| | | | |
|---|---|---|---|
| 4,835,112 A | * | 5/1989 | Pfiester et al. |
| 5,739,064 A | * | 4/1998 | Hu et al. |
| 5,828,131 A | * | 10/1998 | Cabral, Jr. et al. |
| 5,888,888 A | * | 3/1999 | Talwar et al. |
| 5,940,699 A | * | 8/1999 | Sumi et al. |
| 6,001,737 A | * | 12/1999 | Horiuchi et al. |
| 6,004,871 A | * | 12/1999 | Kittl et al. |

OTHER PUBLICATIONS

Huang et al., Impact of Ge Implantation on the Electrical Characteristics of TiSi2 p + /n Shallow Junctions, with an a–Si (or a Poly–Si) Buffer Layer, pp. 601–606, Apr. 1997.*

Mann et al., "Reduction of the C54–TiSi2 Phase Formation Temperature Using Metallic Impurities", Mat. Res. Soc. Symp. Proc. vol. 402, pp. 95–100, 1996.*

Mann, et al., "Reduction of the C54–TiSi$_2$ Phase Formation Temperature Using Metallic Impurities", *Mat. Res. Soc. Symp Proc.* vol. 402 (Materials Research Society, 1996), pp. 95–100.

* cited by examiner

*Primary Examiner*—Long Pham
*Assistant Examiner*—Scott J. Hawranek
(74) *Attorney, Agent, or Firm*—W. James Brady; Frederick J. Telecky, Jr.

(57) ABSTRACT

An embodiment of the instant invention is a method of making a transistor having a silicided gate structure insulatively disposed over a semiconductor substrate, the method comprising the steps of: forming a conductive structure insulatively disposed over the semiconductor substrate (step 302 of FIG. 3); introducing a silicide enhancing substance into the conductive structure (step 304 of FIG. 3); amorphizing a portion of the conductive structure; forming a metal layer on the conductive structure (step 310 of FIG. 3); and wherein the metal layer interacts with the silicide enhancing substance in the amorphized portion of the conductive structure so as to form a lower resistivity silicide on the conductive structure. The conductive structure is, preferably, comprised of: doped polysilicon, undoped polysilicon, epitaxial silicon, or any combination thereof. Preferably, the silicide enhancing substance is comprised of: molybdenum, Co, W, Ta, Nb, Ru, Cr, any refractory metal, and any combination thereof. The metal layer is, preferably, comprised of: titanium, Co, W, Mo, nickel, platinum, palladium, and any combination thereof.

16 Claims, 4 Drawing Sheets

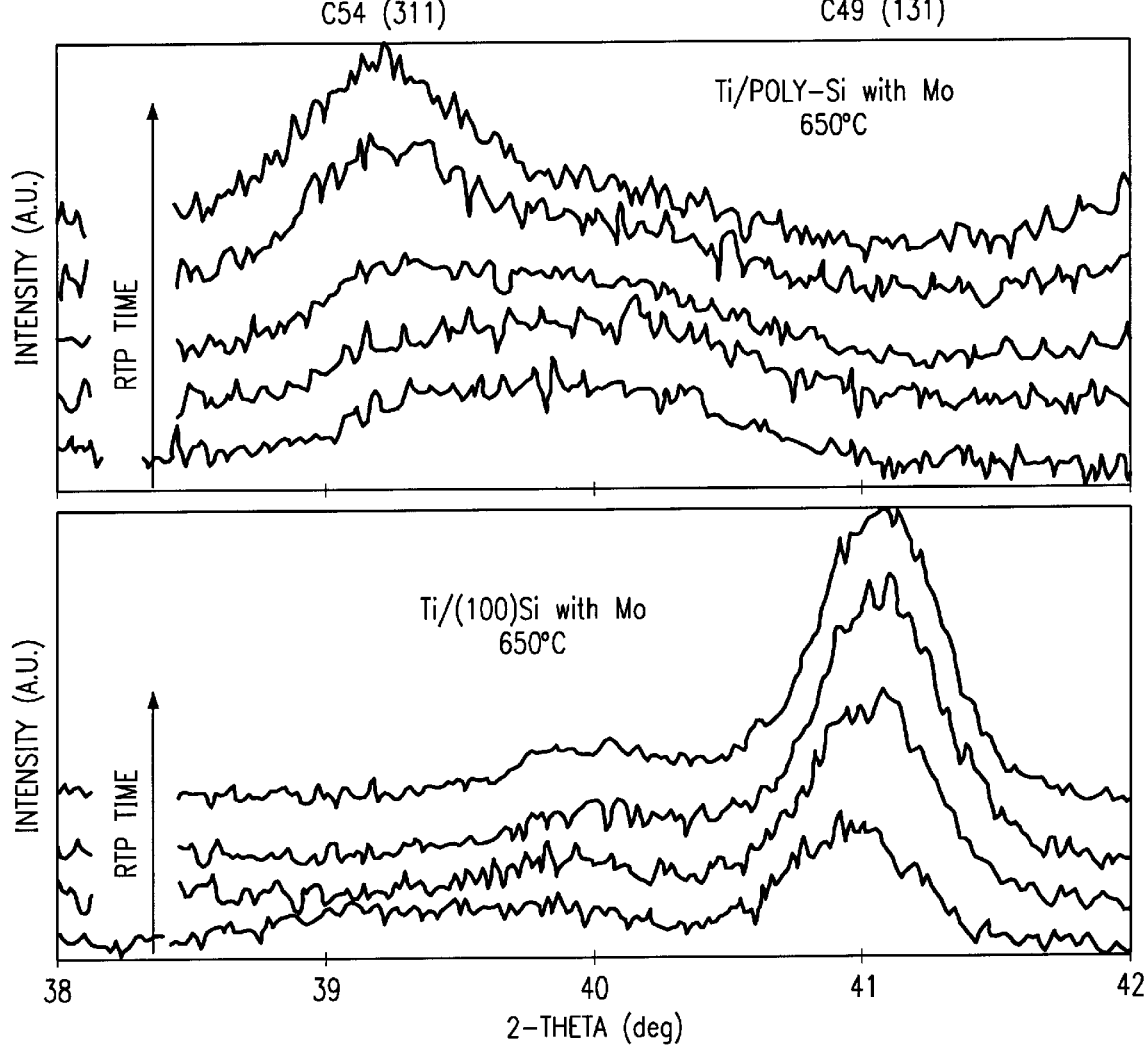
FIG. 2a
FIG. 2b
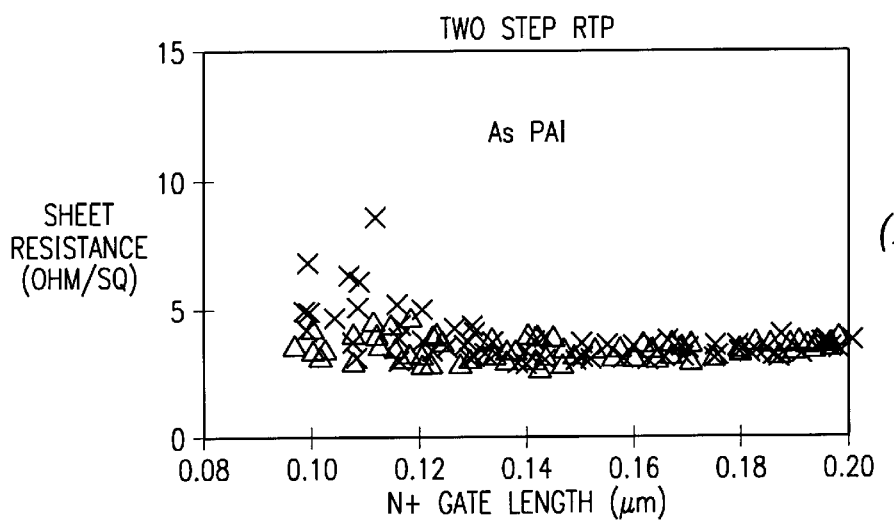
FIG. 6
(PRIOR ART)

METHOD OF FORMING A SILICIDE LAYER USING METALLIC IMPURITIES AND PRE-AMORPHIZATION

This is a Non Provisional application filed under 35 USC 119(e) and claim priority of prior provisional, Ser. No. 60/051,175 of inventor Kittl, et al, filed Jul. 3, 1997.

CROSS-REFERENCE TO RELATED PATENT/PATENT APPLICATIONS

The following commonly assigned patent/patent applications are hereby incorporated herein by reference:

| Ser. No. | Filing Date |
| --- | --- |
| 09/087411 | 05/29/1998 |

FIELD OF THE INVENTION

The instant invention pertains to semiconductor device fabrication and processing and more specifically to a method of forming a silicide region.

BACKGROUND OF THE INVENTION

Titanium silicide has become the most widely-used silicide in the VLSI industry for self-aligned silicide applications because of its combined characteristics of low resistivity, the ability to be self-aligned, and relatively good thermal stability. Although $TiSi_2$ has certain advantages relative to other silicides, the fact that it is a polymorphic material presents additional problems in its use. Specifically, in typical use $TiSi_2$ exists as either an orthorhombic base-centered phase having 12 atoms per unit cell and a resistivity of about 60–90 micro-ohm-cm (known in the industry as the C49 phase—see FIG. 1), or as a more thermodynamically-favored orthorhombic face-centered phase which has 24 atoms per unit cell and a resistivity of about 12–20 micro-ohm-cm (known as the C54 phase). When using the generally-accepted processing conditions for forming titanium silicide, the less-desirable, higher-resistivity C49 phase is formed first. In order to obtain the lower-resistivity C54 phase, a second high-temperature temperature annealing step is required. This second step is disadvantageous because it can have detrimental effects on the silicide and other integrated circuit elements, especially at smaller line-widths. For example, the increasing use of dual-doped polysilicon gate structures in some devices has increased their sensitivity to additional heat cycles, as is required by the second anneal step. Also, silicon nitride peeling and cracking have been associated with the second annealing step. Furthermore, the second anneal step increases PMOS source and drain series resistances, thereby degrading (i.e. decreasing) the device drive current.

A typical set of processing conditions for forming titanium silicide include: (1) pre-cleaning, (2) titanium deposition, (3) silicide formation at a temperature about 700° C., (4) selective etching, and (5) a phase transformation anneal at a temperature greater than about 700° C. It is the phase transformation anneal that converts the dominant C49 phase to the C54 phase. The initial formation temperature is kept about 700° C. or below in order to minimize over-spacer bridging. The second transformation anneal is performed after any unreacted titanium has been selectively removed and is generally performed at temperatures of 50°–200° C. above the formation temperature to insure full transformation to the C54 phase for best control of sheet resistance. However, as device line-widths and silicide film thickness continue to be scaled down, it becomes ever more desirable to eliminate the need for this second anneal step, as discussed further below.

It is generally accepted that the C49 phase forms first because of a lower surface energy than that of the C54 phase. In other words, the higher surface energy of C54 phase forms a higher energy barrier to its formation. The second transformation anneal step used in the standard process above provides the additional thermal energy necessary to both overcome the nucleation barrier associated with forming the new surface and growing the crystalline structure of the newly-forming C54 phase. In VLSI applications, if the phase transformation is inhibited or fails to occur uniformly, a degradation in circuit performance is observed. In some higher-performance circuits, the RC delay associated with a poor phase transformation is typically about 5–10 percent.

A significant limitation on the C49-to-C54 phase transformation is a phenomenon known as agglomeration. If the thermal energy used to obtain the phase transformation is excessive, then a morphological degradation of the titanium silicide results, which is commonly referred to as agglomeration. As line-widths and silicide film thickness decrease, the thermal energy required to affect the C49-to-C54 phase transformation increases, yet the thermal energy level at which the silicide film starts to agglomerate decreases. Thus, there is an ever-shrinking process window for performing this phase transformation, making process control and uniformity more difficult to achieve.

Thus, there is a need for an improved method for forming the C54 phase titanium silicide without requiring a second high-temperature annealing step, as in the generally-accepted process above. Eliminating the second annealing step would reduce the problems and limitations resulting from agglomeration of silicide films during the phase transformation anneal.

One solution to this problem was introduced in U.S. Pat. No. 5,510,295. The solution introduced in this patent involves either depositing a "refractory metal" and a "precursory metal" on a silicon layer simultaneously or putting the "refractory metal" into the silicon layer followed immediately by depositing the "precursory metal" on the silicon layer. While this method facilitates the formation of the low resistivity silicide layer (i.e. C54 phase $TiSi_2$), this method has a few problems.

In a related published article, a method is detailed for putting molybdenum or tungsten between single-crystal or polycrystalline silicon and the titanium layer so as to reduce the temperature of subsequent anneals steps so as to transform to the C54 phase silicide. See R. W. Mann et al., Reduction of the C54-$TiSi_2$ Phase Formation Temperature Using Metallic Impurities, Silicide Thin Films—Fabrication, Properties, and Applications 95–100 (Nov. 27–30, 1995). The implantation of molybdenum ("moly") into the single-crystal silicon substrate or polycrystalline silicon ("poly") overlayer causes "very few crystalline defects and no amorphous regions" in these regions for the method of this publication. Hence, this publication only relates to the lowering of the annealing temperature required to transform a titanium silicide layer into its C54 phase by the implantation of moly into silicon regions (followed by an anneal to eliminate any defects introduced by the implant) prior to deposition and annealing of the titanium layer. As was discussed above, this method suffers from the same deficiencies as U.S. Pat. No. 5,510,295.

While the two aforementioned processes achieve low sheet resistance silicide regions formed on the gate structures, these processes do not form low sheet resistance silicide regions on the source/drain regions. The reaction of the titanium with polycrystalline silicon may form low resistivity C54 phase $TiSi_2$ in the presence of molybdenum impurities in these processes. However, using the same process, the C49 phase $TiSi_2$ will form on single crystal silicon (100). This is illustrated in FIGS. 2(a) and 2(b). FIG. 2(a) illustrates the $TiSi_2$ formed on polycrystalline silicon using one of the two aforementioned prior art processes, and FIG. 2(b) illustrates the silicide formed on single crystal silicon (using the same process).

Another problem with the two aforementioned processes is that it is difficult to form silicide regions with low sheet resistance on gate structures that have a gate length of less than 0.1 microns.

SUMMARY OF THE INVENTION

Basically, the method of the instant invention overcomes this problem by amorphizing a top portion of the gate structure and/or the source/drain regions so that the lower resistivity silicide readily forms in these regions.

An embodiment of the instant invention is a method of making a transistor having a silicided gate structure insulatively disposed over a semiconductor substrate, the method comprising the steps of: forming a conductive structure insulatively disposed over the semiconductor substrate; introducing a silicide enhancing substance into the conductive structure; amorphizing a portion of the conductive structure; forming a metal layer on the conductive structure; and wherein the metal layer interacts with the silicide enhancing substance in the amorphized portion of the conductive structure so as to form a lower resistivity silicide on the conductive structure. The conductive structure is, preferably, comprised of: doped polysilicon, undoped polysilicon, epitaxial silicon, or any combination thereof. Preferably, the silicide enhancing substance is comprised of: molybdenum, Co, W, Ta, Nb, Ru, Cr, any refractory metal, and any combination thereof. The metal layer is, preferably, comprised of: titanium, Co, W, Mo, nickel, platinum, palladium, and any combination thereof.

In another embodiment of the instant invention, the method further includes the step of performing a low temperature anneal step after the step of forming a metal layer on the gate structure. Preferably, the low temperature anneal step is comprised of subjecting the transistor to temperatures in excess of 600 C. (more preferably, around 700 to 800 C.).

Preferably, the step of amorphizing a portion of the conductive structure is accomplished by introducing an amorphizing substance into the conductive structure. The amorphizing substance is, preferably, comprised of: As, Ge, or any combination thereof.

In another embodiment of the instant invention, the step of forming a conductive structure is comprised of the steps of: forming a semiconductive layer insulatively disposed over the semiconductor substrate; doping the semiconductive layer; and etching portions of the semiconductive layer so as to form the conductive structure. Preferably, the step of introducing the silicide enhancing substance is performed prior to the step of etching portions of the semiconductive layer; or it is performed after the step of etching portions of the semiconductive layer so that the silicide enhancing substance is introduced into the conductive structure and source/drain regions formed in the semiconductor substrate.

In another embodiment of the instant invention, the method further includes the steps of: introducing source/drain dopants into the semiconductor substrate in locations which are adjacent to the conductive structure; and performing a source/drain anneal step at an elevated temperature. The step of amorphizing a portion of the conductive structure is, preferably, performed after the step of performing a source/drain anneal step. The portion of the semiconductor substrate where the source/drain dopants are introduced may or may not be amorphized during the step of amorphizing a portion of the conductive structure. In an alternative embodiment, the step of introducing a silicide enhancing substance into the conductive structure is comprised of depositing a layer of the silicide enhancing substance over at least a portion of the semiconductor substrate and the conductive structure and reacting the layer of silicide enhancing substance with the conductive structure.

BRIEF DESCRIPTION OF THE DRAWINGS

FIGS. 2(a) and 2(b) are x-ray diffraction patterns showing the phase of the silicide regions formed on polycrystalline silicon and single crystal silicon, respectively, using a prior art method of forming the silicide regions.

FIG. 5 illustrates the resistivity of a conductive gate structure an overlying silicide layer formed either by the method of the instant invention or a conventional method.

FIG. 6 is a graph illustrating the resistivity of a conductive gate structure having an overlying silicide layer formed using a prior art method of forming the silicide region.

DETAILED DESCRIPTION OF THE DRAWINGS

While the following description of the instant invention revolves around FIGS. 4a–4f, the instant invention can be utilized in any semiconductor device structure. The instant invention is applicable to the formation of any silicide region. While the preferred silicide enhancing substance is molybdenum, other materials such as Co, W, Ta, Nb, Ru, or Cr can be used. The preferred amorphizing substance to introduce into the silicon-containing layer or substrate, preferably accomplished by a preamorphization implant ("PAI"), is either Ge or As, but any substance/element can be used so that it causes the silicon-containing layer or substrate to become amorphous for at least 10 to 30 nm into the layer or substrate. In addition, while the preferred silicide material is titanium, other materials such as Co, W, Mo, nickel, platinum, and palladium may be used.

Figure 3:
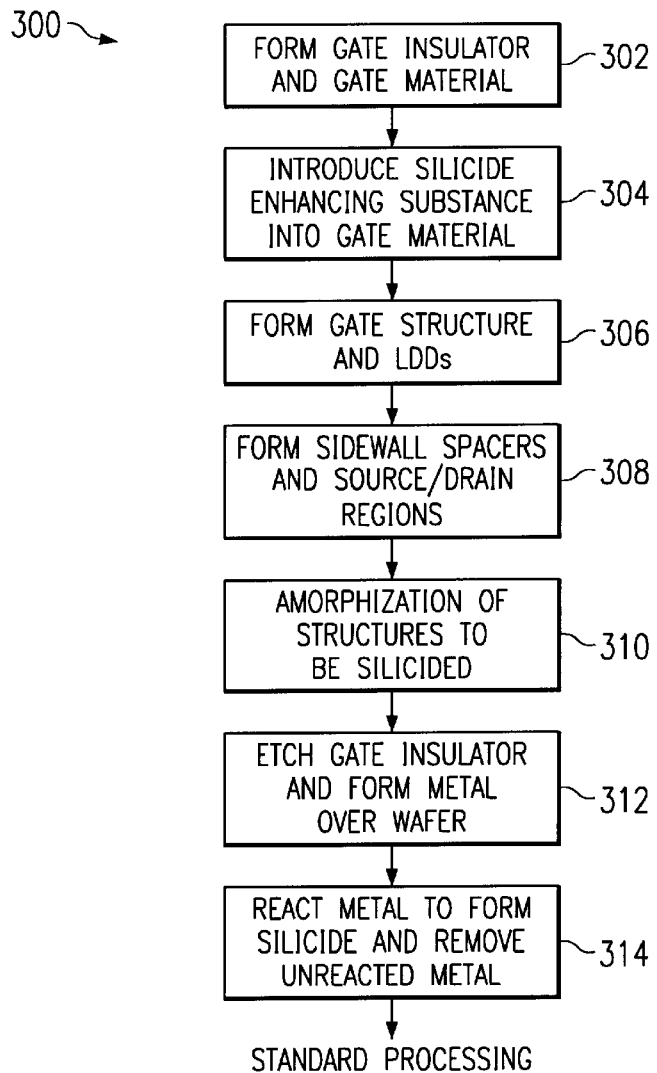
FIG. 3 is a flow chart illustrating the method of one embodiment of the instant invention.
Figure 4A:
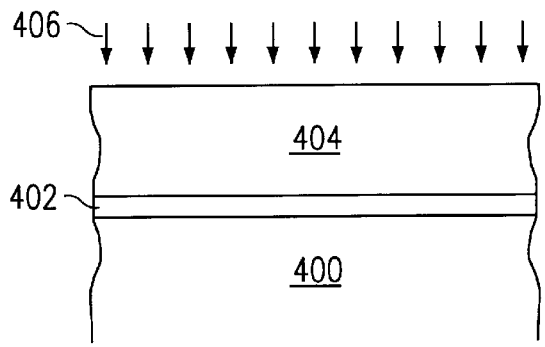
FIGS. 4a–4f are cross-sectional views illustrating the processing of a device using the method of the instant invention illustrated in FIG. 3.

The following description of the method of the instant invention will revolve around FIGS. 3 and 4a–4f. Referring to FIGS. 3 and 4a, substrate 400 is provided and a gate dielectric is formed on substrate 400 (step 302). Gate dielectric 402 may be comprised of an oxide, thermally grown $SiO_2$, a nitride, an oxynitride, or any combination thereof, and is preferably on the order of 2 to 10 nm thick.

In step 302, silicon-containing layer 404 is formed on gate dielectric 402. Preferably, layer 404 is comprised of polycrystalline silicon ("poly" or "polysilicon"), but layer 404 may be comprised of epitaxial silicon or any other semiconducting material. Next, a dopant is introduced into layer 404 so as to increase the conductivity of layer 404. This is preferably followed by an anneal step so as to drive the dopant into layer 404. Alternatively, the dopant may be introduced when the source/drain regions are doped, instead of being doped at this point.

Either before or after the dopant is introduced into layer 404 and the anneal step is performed, a silicide enhancing substance 406 is introduced into layer 404 (step 304). The purpose of this material is to aid in the formation of C54 phase silicide on layer 404. Preferably, the silicide enhancing substance is comprised of Mo. However, as stated above, this substance may be comprised of many different elements or a combination of elements. More specifically, the silicide enhancing substance is preferably a substance that promotes the formation of C54 phase silicidation of a liter deposited metal. Most likely this means that when the subsequent metal layer is deposited on layer 404 (which has a fairly high concentration of the silicide enhancing substance at the upper most surface) it will either form the C54 phase silicide directly or will more readily transform from the C49 phase to the C54 phase in a following anneal step.

Preferably, the silicide enhancing substance is implanted into layer 404 using ion implantation. However, this substance may also be introduced into or on layer 404 by depositing the substance onto layer 404 (preferably by PVD or CVD). Preferably, the source of the silicide enhancing substance is solid molybdenum and the concentration of the substance in layer 404 is around $10^{19}$ to $10^{20}$ atoms/cm$^3$. The implant energy of the moly is preferably around 35 keV and the moly dose is preferably around $1\times10^{13}$ to $5\times10^{14}$ atoms/cm$^2$. Furthermore, step 304 may be performed after the gate material is etched (so as to form the gate structure) in step 306. Alternatively, the silicide enhancing substance (preferably moly) may be introduced after step 308 or after step 310.

Figure 4B:
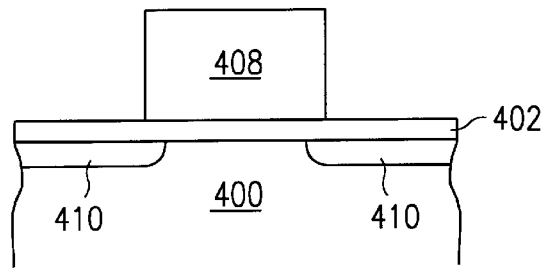

Referring to FIGS. 3 and 4b, in step 306 a pattern (not shown) is formed on layer 404 and portions of layer 404 are removed so as to form gate structure 408. Preferably this is accomplished by an anisotropic etch step, but one of ordinary skill in the art will know how to perform these patterning and etch steps. In step 306, implants for lightly doped drains 410 are performed (if at all). This is a standard processing step for both PMOS and NMOS structures.

Figure 4C:
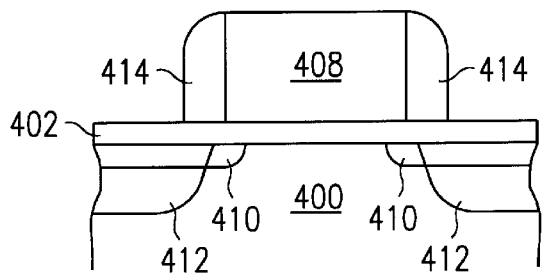

Referring to FIGS. 3 and 4c, in step 308, sidewall spacers 414 are formed. Preferably, sidewall spacers are comprised of oxygen, nitrogen or a combination of the two. Next, source/drain regions 412 are preferably formed by implanting boron, phosphorous, and/or arsenic into the substrate and performing an anneal step (shown as region 416 in FIG. 4d). Step 308 is a standard processing step in DRAM and logic device process flows.

Figure 4D:
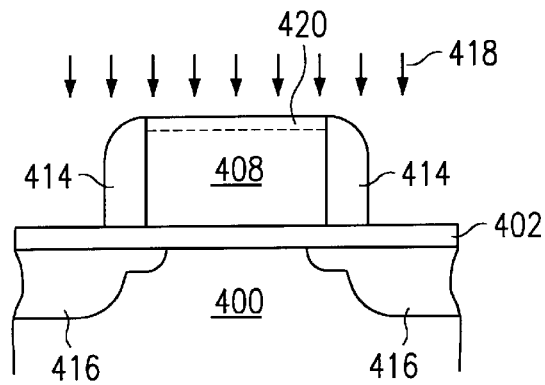

Referring to step 310 of FIG. 3 and FIG. 4d, the upper most portion of conductive gate structure is amorphized using the method of the instant invention. In one embodiment of the instant invention, this is accomplished by implanting an amorphizing substance, preferably Ge or As, into gate structure 408 at an energy level (preferably around 30 keV if gate insulator 402 covers the source/drain regions and around 20 to 25 keV if it is removed in these areas) and dosage (preferably around $1\times10^{14}$ to $3\times10^{14}$) sufficient enough to cause the amorphization of around 10 to 50 nm (preferably on the order of 25 to 35 nm—more preferably around 30 nm) into the upper most surface of gate structure 408. This amorphous region is denoted as region 420 in FIG. 4d. In an alternative embodiment, moly, any noble gas, Si, BF$_2$, or B is implanted into the gate structure so as to amorphize the upper most surface of the gate structure. Generally, any substance may be used as the amorphizing agent, but, preferably, not substances that degrade the device (such as Cu or Fe). In another embodiment, the amorphization is performed on both the upper surface of the gate structure and the upper surface of the substrate in portions of the source and/or drain regions.

Figure 4E:
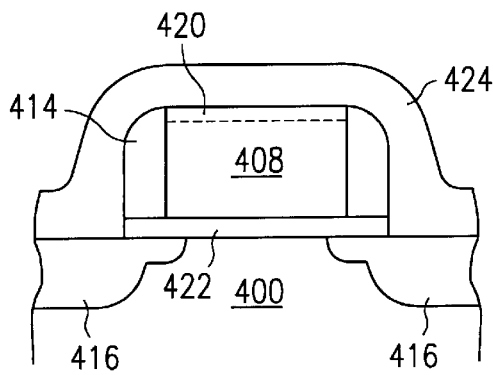

Referring to FIGS. 3 and 4e, in step 312, portions of insulating layer 402 may be etched so as to form gate insulator 422 and to expose source/drain regions. In an alternate embodiment, insulating layer 402 is not removed at this point. Next, metal 424 is deposited on gate structure 408 (in the region 420 where the gate structure is amorphous and where the moly resides from step 304. In addition, metal 424 (preferably titanium but it can also be comprised of tungsten, molybdenum, cobalt, nickel, platinum, or palladium) is formed on sidewall insulators 414 and the substrate over source/drain regions 416 (however, insulator 402 may be left above these regions so as to avoid the formation of a silicide over source/drain regions 416 in this step).

Figure 4F:
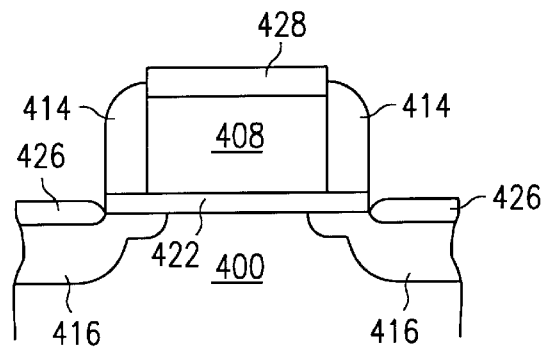

Referring to FIG. 3 and FIG. 4f, silicide regions 426 and 428 are formed in step 314. Silicided regions may be formed only on gate structure 408, only in source/drain regions 416, or in both. FIG. 4f depicts the formation of silicide regions 426 and 428 (on source/drain regions 416 and gate structure 408, respectively). Preferably, step 314 is comprised of reacting the metal with any underlying semiconductor regions by performing a silicide formation step at a temperature of around 700 to 780 C. Using the method of the instant invention, a second, high-temperature, anneal step is not necessary to transform silicide regions 426 and 428 to their low resistivity phase (i.e. C54 phase for Ti) because the low resistivity silicide will be formed directly on region 408 (after the deposition of the metal and the low temperature anneal discussed above) which has a fairly high concentration of the silicide enhancing substance at its uppermost surface and is amorphous for approximately 15 to 35 nm from the upper most surface of the structure. Hence, when the silicide is formed on gate structure 408 it most likely will form the C54 phase as opposed to forming the C49 phase. Therefore, since silicide regions 426 and 428 are already in the C54 phase a subsequent anneal (typically used to transform the deposited metal and the underlying silicon from C49 phase silicide to C54 phase silicide) does not have to be performed.

While the instant invention is described with regards to the above process flow, another embodiment involves a slightly different process flow. More specifically, step 302 is performed so as to form the gate insulating layer and the gate material. Next, steps 306 and 308 are performed so as to form the gate structure, the LDD's, and the source/drain regions. This is followed by performing an anneal step so as to activate the dopants implanted in steps 306 and 308. Step 310 is performed next. Preferably, this is accomplished in the same manner as described above—implanting As or Ge into the gate structure and/or the source/drain regions. Next, silicide enhancing substance 406 is introduced into at least the gate structure (and most likely into the source/drain regions, also). This is followed by the formation of a metal layer (preferably titanium) on the structure and a thermal step (preferably either an anneal step or a rapid thermal anneal step) so as to form the silicide regions.

Basically, the instant invention can be performed using at least two different embodiments with variations to each of these embodiments. In one embodiment, the gate structure is formed followed by the formation of the sidewall insulators and the lightly doped drain regions. Next, either the silicide enhancing material is introduced followed by the source/drain implants, or the source/drain implants are performed followed by the introduction of the silicide enhancing material. An anneal step is performed next so as to activate the source/drain implants. Either the cap oxide is removed followed by the amorphization of the gate and the source/drain region, or the amorphization step is performed followed by the removal of the cap oxide. The metal is deposited, next, followed by a low temperature anneal and standard processing.

In the other embodiment, after the gate is patterned and etched and the source/drain regions are implanted and annealed either portions of cap oxide (shown in FIG. 4 as layer 402) are removed to expose the source/drain regions followed by the amorphization step or the amorphization step is performed followed by the removal of portions of the cap oxide. Next, a layer of the silicide enhancing material (preferably Mo) is formed. This is followed by the formation of the metal layer (preferably Ti) and a low temperature anneal.

In all of these embodiments, a high temperature anneal may be performed after the low temperature anneal, which is used to react the Ti with the underlying silicon. Typically, the high temperature anneal step is used to convert the C49 phase silicide (formed with the Ti reacts with the Si in the low temperature anneal step) to the lower resistivity C54 phase silicide. However, since the silicide formed using the instant invention is most likely all (or mostly) C54 phase silicide, this high temperature anneal step may or may not be performed. Preferably, this high temperature anneal step, if performed, will be at around 800 to 950 C.

Figure 1:
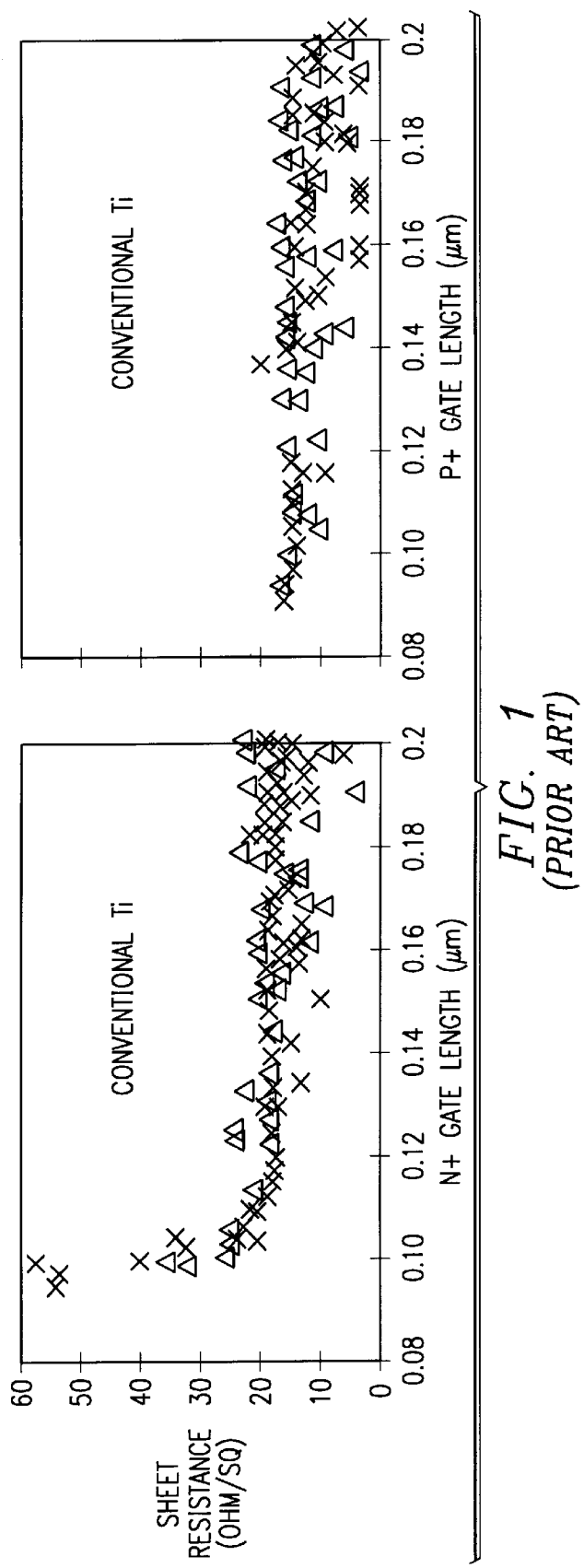
FIG. 1 is a graph illustrating sheet resistance versus gate length for devices formed using a conventional silicide process flow.
Figure 5:
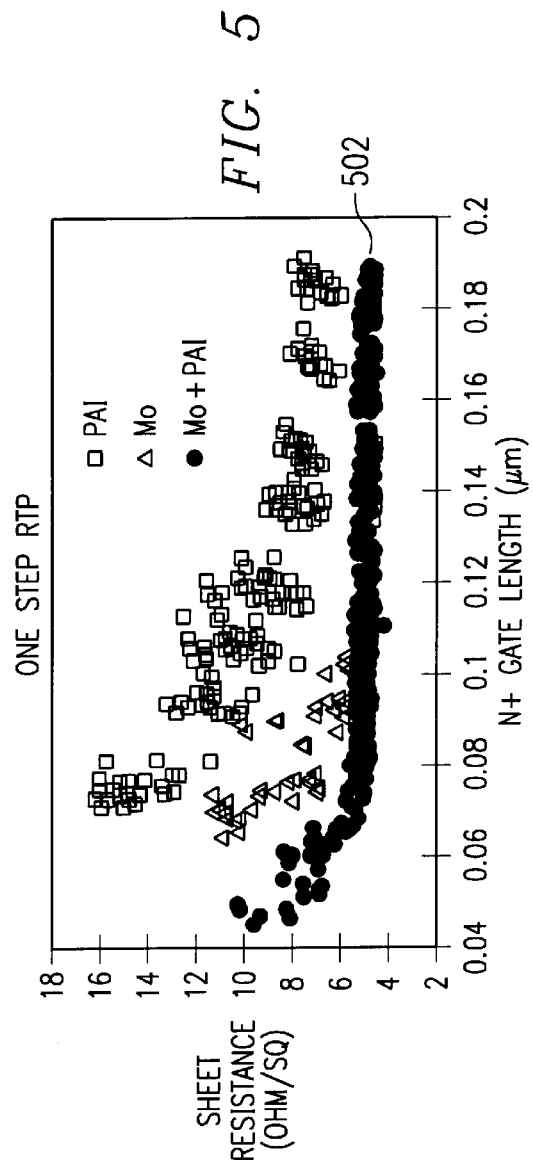
FIG. 5 is a graph illustrating device characteristics of devices fabricated using the method of the instant invention and devices fabricated using prior art methods.

FIG. 5 is a graph illustrating sheet resistance versus gate length for silicide formation methods which involve introducing molybdenum and/or an amorphizing substance into the structure which is to be silicided. The instant invention is depicted as plot 502 in this figure. FIG. 6 illustrates the sheet resistance versus gate length for silicide formation methods of the prior art. The data points of FIG. 6 where obtained for silicide regions formed with two anneal steps (a lower temperature anneal to form the silicide and a higher temperature anneal to convert from C49 phase to C54 phase). The data of FIG. 5 where obtained for silicide regions formed with only the anneal step depicted in step 314. As can be seen by comparing FIG. 5 to FIG. 6, the silicide regions formed using the instant invention (shown in FIG. 5) have a lower resistivity for gate length of less than 0.1 microns than the suicides formed using the prior art methods.

Figure 7:
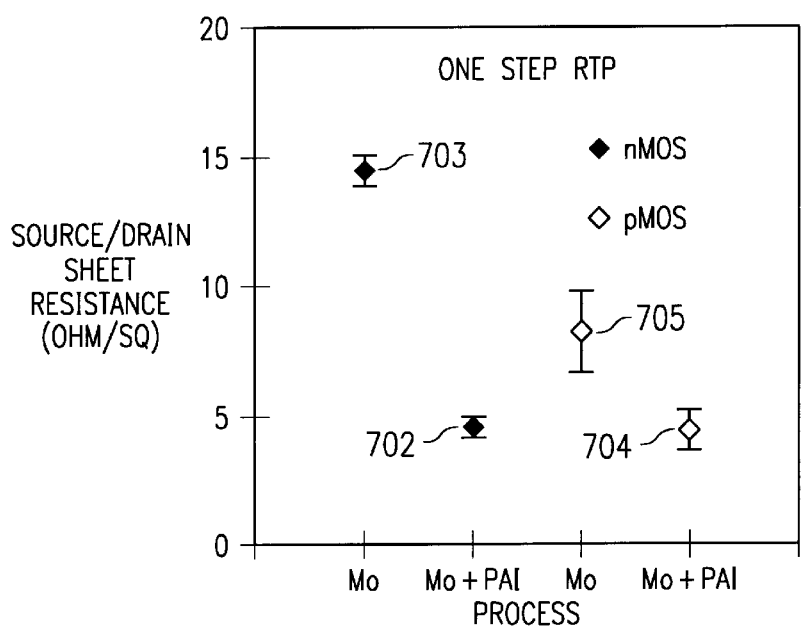
FIG. 7 is a graph illustrating the source/drain sheet resistance of the instant invention (plots 702 and 704) versus prior art methods (plots 703 and 705).

FIG. 7 is a graph illustrating source/drain resistance for different processes where the silicide is formed in the source/drain regions. Plots 702 and 704 depict the sheet resistance of devices formed using the instant invention. Plots 703 and 705 depict the sheet resistance of devices formed using prior art methods.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of making a transistor having a silicided gate structure insulatively disposed over a silicon surface of a semiconductor substrate, the silicide having first and second phases, the first phase being lower in resistivity than the second phase, said method comprising the steps of:

forming a conductive structure comprised of silicon insulatively disposed over said semiconductor substrate, and defining source/drain regions of said surface on opposite sides of the conductive structure;

introducing a silicide enhancing substance into said conductive structure;

amorphizing a portion of said conductive structure;

forming a metal layer on said conductive structure; and after the introducing, amorphizing, and forming steps, reacting said metal layer with silicon of said conductive structure to form the silicide, in its first phase, on said conductive structure.

2. The method of claim 1, wherein said conductive structure is comprised of a material selected from the group consisting of: doped polysilicon, undoped polysilicon, epitaxial silicon, and any combination thereof.

3. The method of claim 1, wherein said silicide enhancing substance is comprised of a substance selected from the group consisting of: molybdenum, Co, W, Ta, Nb, Ru, Cr, any refractory metal, and any combination thereof.

4. The method of claim 1, wherein said metal layer is comprised of a material selected from the group consisting of: titanium, Co, W, Mo, nickel, platinum, palladium, and any combination thereof.

5. The method of claim 1, wherein the reacting step comprises performing a low temperature anneal.

6. The method of claim 5, wherein said low temperature anneal is performed at a temperature in excess of 600 C.

7. The method of claim 5, wherein said low temperature anneal is performed at a temperature around 700 to 800 C.

8. The method of claim 1, wherein said step of amorphizing a portion of said conductive structure is accomplished by introducing an amorphizing substance into said conductive structure.

9. The method of claim 8, wherein said amorphizing substance is comprised of a substance selected from the group consisting of: As, Ge, or any combination thereof.

10. The method of claim 1, wherein said step of forming a conductive structure is comprised of the steps of:

forming an insulating layer over said substrate;

forming a silicon layer over said insulating layer;

doping said silicon layer; and etching portions of said silicon layer so as to form said conductive structure.

11. The method of claim 10, wherein said step of introducing said silicide enhancing substance is performed prior to said step of etching potions of said silicon layer.

12. The method of claim 10, wherein said step of introducing said silicide enhancing substance is performed after said step of etching portions of said silicon layer so that said silicide enhancing substance is introduced into both said conductive structure and said source/drain regions.

13. The method of claim 10, further comprising the steps of:

introducing source/drain dopants into said source/drain regions; and performing a source/drain anneal step at an elevated temperature.

14. The method of claim 13, wherein said step of amorphizing a portion of said conductive structure is performed after said step of performing a source/drain anneal step.

15. The method of claim 13, wherein said source/drain regions are also amorphized during said step of amorphizing a portion of said conductive structure.

16. The method of claim 13, wherein said step of introducing a silicide enhancing substance into said conductive structure is comprised of depositing a layer of said silicide enhancing substance over at least a portion of said semiconductor substrate and said conductive structure and reacting said layer of silicide enhancing substance with said conductive structure.

* * * * *